US010256343B2

(12) United States Patent
Cheng et al.

(10) Patent No.: US 10,256,343 B2
(45) Date of Patent: Apr. 9, 2019

(54) THIN FILM TRANSISTOR, ARRAY SUBSTRATE AND THEIR MANUFACTURING METHODS, AND DISPLAY APPARATUS

(71) Applicant: BOE TECHNOLOGY GROUP CO., LTD., Beijing (CN)

(72) Inventors: Leilei Cheng, Beijing (CN); Kai Xu, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 15/311,642

(22) PCT Filed: Mar. 1, 2016

(86) PCT No.: PCT/CN2016/075114
§ 371 (c)(1),
(2) Date: Nov. 16, 2016

(87) PCT Pub. No.: WO2017/054407
PCT Pub. Date: Apr. 6, 2017

(65) Prior Publication Data
US 2018/0182895 A1    Jun. 28, 2018

(30) Foreign Application Priority Data
Sep. 30, 2015 (CN) .......................... 2015 1 0640918

(51) Int. Cl.
*H01L 29/786* (2006.01)
*H01L 21/288* (2006.01)
(Continued)

(52) U.S. Cl.
CPC .. *H01L 29/78606* (2013.01); *G02F 1/133345* (2013.01); *H01L 21/0223* (2013.01);
(Continued)

(58) Field of Classification Search
CPC ......... H01L 29/78606; H01L 21/02118; H01L 21/02164; H01L 21/0223; H01L 21/02282;
(Continued)

(56) References Cited

U.S. PATENT DOCUMENTS

2003/0076452 A1* 4/2003 Kim .................... G02F 1/13458
349/43
2003/0136958 A1* 7/2003 Ong ...................... C08G 61/126
257/40

(Continued)

FOREIGN PATENT DOCUMENTS

CN        1790741 A       6/2006
CN     101051158 A       10/2007
(Continued)

OTHER PUBLICATIONS

First Office Action for Chinese Application No. 201510640918.7, dated Oct. 11, 2017, 6 Pages.

(Continued)

*Primary Examiner* — Dzung Tran
(74) *Attorney, Agent, or Firm* — Brooks Kushman P.C.

(57) ABSTRACT

The present disclosure discloses a thin film transistor, an array substrate and their manufacturing methods, and a display apparatus. The method for manufacturing the thin film transistor of the present disclosure comprises a step of forming an insulation layer, wherein the step of forming the insulation layer further comprises forming a siloxane material layer, oxidizing the siloxane material layer such that an inorganic silicon film is formed on a surface of the siloxane material layer, and curing the oxidized siloxane material layer to obtain the insulation layer. In this disclosure, the outer layer of the insulation layer is an inorganic silicon film which is a commonly-used material for making the insulation layer in prior art, and the inner layer of the insulation (Continued)

layer is made of the siloxane material having a low dielectric constant and high chemical stability.

16 Claims, 4 Drawing Sheets

(51) Int. Cl.
  H01L 29/49   (2006.01)
  H01L 29/51   (2006.01)
  H01L 27/12   (2006.01)
  H01L 21/02   (2006.01)
  G02F 1/1333  (2006.01)
  G02F 1/1362  (2006.01)
  G02F 1/1368  (2006.01)

(52) U.S. Cl.
  CPC .. *H01L 21/02118* (2013.01); *H01L 21/02164* (2013.01); *H01L 21/02282* (2013.01); *H01L 21/288* (2013.01); *H01L 27/12* (2013.01); *H01L 27/1225* (2013.01); *H01L 27/1262* (2013.01); *H01L 29/49* (2013.01); *H01L 29/51* (2013.01); *H01L 29/786* (2013.01); *H01L 29/7869* (2013.01); *G02F 1/1368* (2013.01); *G02F 1/136227* (2013.01); *G02F 2202/02* (2013.01)

(58) Field of Classification Search
  CPC ............. H01L 27/1225; H01L 27/1262; H01L 29/7869
  USPC ........................................................ 257/43
  See application file for complete search history.

(56) References Cited

U.S. PATENT DOCUMENTS

| | | | |
|---|---|---|---|
| 2006/0091394 | A1 | 5/2006 | Honda |
| 2006/0238112 | A1* | 10/2006 | Kasama ................. B82Y 10/00 313/504 |
| 2006/0267491 | A1* | 11/2006 | Koo ..................... H01L 27/3265 313/511 |
| 2007/0031701 | A1* | 2/2007 | Nakashima .......... C07D 209/88 428/690 |
| 2007/0236623 | A1 | 10/2007 | Heo et al. |
| 2008/0105866 | A1* | 5/2008 | Jeong ...................... C07F 9/14 257/40 |
| 2009/0153781 | A1 | 6/2009 | Otani et al. |
| 2010/0140623 | A1 | 6/2010 | Min et al. |
| 2012/0032160 | A1* | 2/2012 | Furukawa ............ C07D 209/88 257/40 |
| 2016/0027801 | A1 | 1/2016 | Jiang et al. |

FOREIGN PATENT DOCUMENTS

| | | |
|---|---|---|
| CN | 101752364 A | 6/2010 |
| CN | 102437195 A | 5/2012 |
| CN | 103811503 A | 5/2014 |
| CN | 103985764 A | 8/2014 |
| CN | 105304497 A | 2/2016 |

OTHER PUBLICATIONS

International Search Report and Written Opinion for Application No. PCT/CN2016/075114, dated Jun. 30, 2016, 8 Pages.

Olah et al., Hydrophobic recovery of UV/ozone treated poly(dimenthylsiloxane): adhesion studies by contact mechanics and mechanism of surface modification, Applied Surface Science, Jul. 20, 2004, pp. 410-423, Netherlands, 14 pages.

Third Office Action for Chinese Application No. 201510640918.7, dated Feb. 2, 2019, 8 Pages.

* cited by examiner

THIN FILM TRANSISTOR, ARRAY SUBSTRATE AND THEIR MANUFACTURING METHODS, AND DISPLAY APPARATUS

CROSS-REFERENCE TO RELATED APPLICATIONS

This application is the U.S. national phase of PCT Application No. PCT/CN2016/075114 filed on Mar. 1, 2016, which claims priority to Chinese Patent Application No. 201510640918.7 filed on Sep. 30, 2015, the disclosures of which are incorporated in their entirety by reference herein.

TECHNICAL FIELD

The present disclosure relates to the field of liquid crystal display, in particular to a thin film transistor (TFT), an array substrate and their manufacturing methods, and a display apparatus.

BACKGROUND

In existing processes for manufacturing an oxide TFT array substrate, an electrode insulation layer is usually made of one of the following two kinds of materials. One is an inorganic material having a high dielectric constant, such as silicon nitride and silicon dioxide, but it is unable to suppress capacitance effect generated by electrodes to a relatively low level while improving a threshold voltage of the TFT. Moreover, the process for forming an insulation film of the inorganic material is complicated, and several times of deposition is needed to complete the formation of a thicker inorganic insulation film. The other is an organic polymeric material that has advantages of easily-controllable performance, easiness of processing, suitability for large-area production, etc., and that can be processed by a simple method such as spin-coating, coating or printing at room temperature, which significantly reduces production cost. However, since the dielectric constants of these polymeric materials are relatively low, when they are used alone to make the insulation layer of the TFT, a higher threshold voltage of the TFT will be required. This will cause bigger leakage current and thus affect the use of the polymeric material for the insulation layer of the TFT.

SUMMARY

An object of the present disclosure is to provide a thin film transistor, an array substrate and their manufacturing method, and a display apparatus. In this disclosure, capacitance effect generated by electrodes can be effectively suppressed through a new process for manufacturing an insulation layer.

To realize the above object, an aspect of the present disclosure provides a method for manufacturing a thin film transistor, comprising a step of forming an insulation layer, wherein the step of forming the insulation layer comprises:
forming a siloxane material layer;
oxidizing the siloxane material layer such that an inorganic silicon film is formed on a surface of the siloxane material layer; and
curing the oxidized siloxane material layer to obtain the insulation layer.

According to one embodiment of the present disclosure, the step of forming the siloxane material layer comprises: forming the siloxane material layer in one step by a coating or spin-coating process.

According to one embodiment of the present disclosure, the step of oxidizing the siloxane material layer comprises: oxidizing the siloxane material layer through UV light or ozone.

Another aspect of the present disclosure provides a method for manufacturing an array substrate, comprising steps of forming a plurality of insulation layers, wherein the step of forming at least one an insulation layer comprises:
forming a siloxane material layer;
oxidizing the siloxane material layer such that an inorganic silicon film is formed on a surface of the siloxane material layer; and
curing the oxidized siloxane material layer to obtain the insulation layer.

According to one embodiment of the present disclosure, the step of forming the siloxane material layer comprises: forming the siloxane material layer in one step by a coating or spin-coating process.

According to one embodiment of the present disclosure, the step of oxidizing the siloxane material layer comprises: oxidizing the siloxane material layer through UV light or ozone.

Still another aspect of the present disclosure also provides a thin film transistor comprising one or more insulation layers, wherein at least one insulation layer is a siloxane material layer pattern with an inorganic silicon film covering its outer surface.

Still another aspect of the present disclosure also provides an array substrate comprising one or more insulation layers, wherein at least one insulation layer is a siloxane material layer pattern with an inorganic silicon film covering its outer surface.

According to one embodiment of the present disclosure, the array substrate further comprises: a gate electrode, a source electrode and an active layer,
wherein the insulation layer comprises a first insulation layer arranged between the gate electrode and the source electrode, and a second insulation layer arranged between the source electrode and the active layer,
the active layer is arranged between the first insulation layer and the source electrode, and
a first via-hole is formed through the second insulation layer at a first position corresponding to the active layer locates, and the source electrode is connected with the active layer through the first via-hole.

According to one embodiment of the present disclosure, the source electrode is located above the gate electrode, and the array substrate further comprises a pixel electrode located above the source electrode;
the insulation layer further comprises a third insulation layer arranged between the pixel electrode and the source electrode;
a second via-hole is formed the second insulation layer at a second position corresponding to the active layer, and a third via-hole is formed through the third insulation layer at a second position corresponding to the active layer, the second via-hole and the third via-hole communicate with each other to form a fourth via-hole; and
the pixel electrode is connected with the active layer through the fourth via-hole.

According to one embodiment of the present disclosure, the insulation layer further comprises: a protective layer arranged above the pixel electrode.

Still another aspect of the present disclosure further provides a display apparatus comprising the array substrate described above.

In the above-mentioned technical solutions of the present disclosure, the following advantageous effects are produced:

the outer layer of the insulation layer in the technical solutions is the inorganic silicon film that is a commonly-used material for making the insulation layer in prior art. Moreover, the inner layer of the insulation layer is made of the siloxane material having a low dielectric constant and high chemical stability. Therefore, the capacitance effect generated by electrodes of the TFT can be stably inhibited, the TFT driven by a low voltage, and power consumption effectively reduced.

DETAILED DESCRIPTION

In order to make the technical problem to be solved, technical solutions and advantages of the present disclosure more clear, the present disclosure will be described below in detail in combination with the drawings and embodiments.

Figure 1:
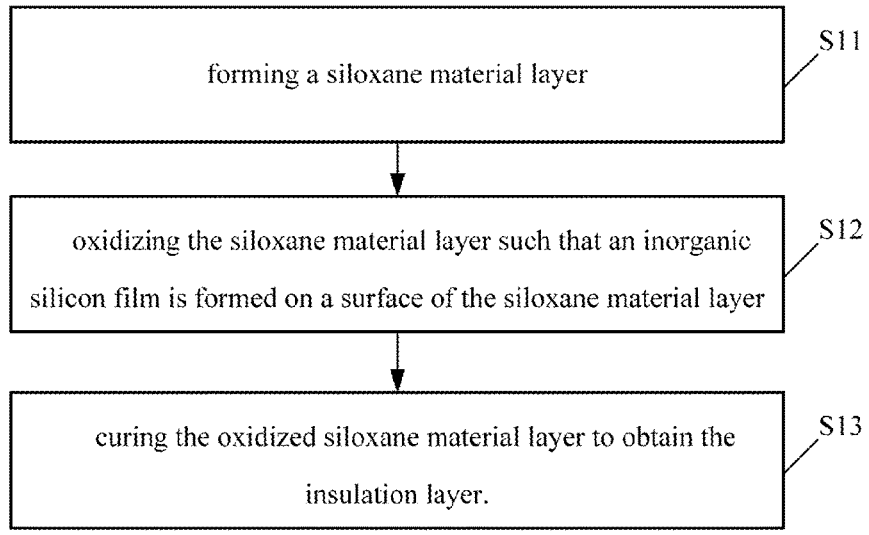
FIG. 1 is a schematic diagram showing steps of forming an insulation layer in the method for manufacturing a thin film transistor of the present disclosure.

To solve the problem existing in prior art, an aspect of the present disclosure provides a thin film transistor and a method for manufacturing the same. The thin film transistor comprises at least one insulation layer that is a siloxane material layer pattern with an inorganic silicon film covering its outer surface. The method for manufacturing the thin film transistor comprises steps of forming the insulation layer. As shown in FIG. 1, the step of forming the insulation layer comprises the following steps S11 to S13.

S11: forming a siloxane material layer. The siloxane material is an organic polymer which may be, for example, polydimethylsiloxane or a modified material thereof. The modified material may be polydimethylsiloxane functionalized by hydroxyl groups, polystyrene-b-polydimethylsiloxane, or the like.

S12: oxidizing the siloxane material layer such that an inorganic silicon film forms on a surface of the siloxane material layer. The main component of the inorganic silicon film is silicon dioxide which is a commonly-used material for making the insulation layer in existing thin film transistors.

S13: curing the oxidized siloxane material layer to obtain the insulation layer.

In the manufacturing method of this embodiment, a new process is adopted for manufacturing the insulation layer. Through this new process, the outer layer of the insulation layer is the inorganic silicon film that is a commonly-used material for making the insulation layer in prior art, and the inner layer of the insulation layer is made of the siloxane material having a low dielectric constant and high chemical stability. Therefore, the capacitance effect generated by electrodes of the TFT can be stably inhibited, the TFT driven by a low voltage, and power consumption can be effectively reduced.

Below, the manufacturing process of the insulation layer formed as described in steps S11 to S13 will be given in detail.

Figure 2:
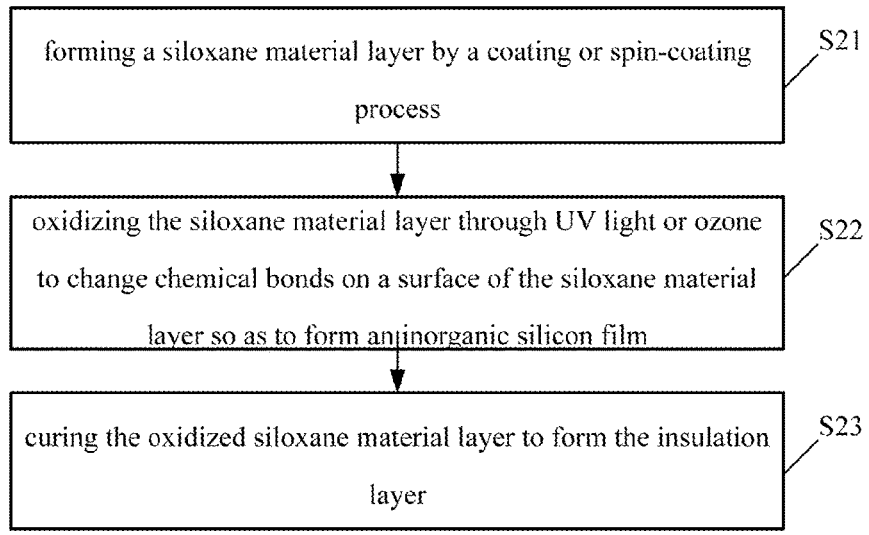
FIG. 2 is a schematic diagram showing detailed steps of forming an insulation layer in the method for manufacturing a thin film transistor of the present disclosure.

As shown in FIG. 2, in this embodiment, the detailed process for manufacturing the insulation layer comprises:

S21: forming a siloxane material layer by a coating or spin-coating process;

S22: oxidizing the siloxane material layer through UV light or ozone to change chemical bonds on a surface of the siloxane material layer so as to form an inorganic silicon film.

S23: curing the oxidized siloxane material layer to form the insulation layer. Step S23 is mainly used to cure the inorganic silicon film in the outer layer so as to compensate for the hardness of the siloxane material in the inner layer. Moreover, as a feasible solution, the curing in Step S23 may be conducted at a temperature of about 55 to 60 degrees Celsius for a period of time between 3 and 4 hours.

The above are detailed processes for manufacturing the insulation layer in the embodiments of the present disclosure. In prior art, when an inorganic silicon material is used for making the insulation layer, a high-cost deposition process is needed for direct deposition of the inorganic silicon material. Because the inorganic silicon material has very high surface energy, it is necessary to repeat the deposition so as to satisfy the requirement of a certain thickness, and such a process cannot meet the requirement of manufacturing a large-sized display panel. Furthermore, in prior art, the whole insulation layer is made of the inorganic silicon material, thus the curing of the inorganic silicon material will require a temperature of up to 300 degrees Celsius.

In comparison with prior art, the step of forming the insulation layer in the method for manufacturing the thin film transistor of this embodiment comprises first forming a siloxane material layer by a low-cost coating or spin-coating process. Since the siloxane material is liquid and has an extremely low surface energy, it is very easy to form a smooth and uniform coating, and the manufacturing requirement of a large-sized display panel can be met. Further, the inorganic silicon film on the outer surface of the insulation layer can be formed through a simple oxidation treatment. Furthermore, because only the outer surface is made of the inorganic silicon material, the curing temperature is only required to reach 60 degree Celsius. As compared with prior art, the method for manufacturing the thin film transistor of this embodiment is far less complicated.

Another aspect of the present disclosure further provides a method for manufacturing an array substrate, and the insulation layer on the array substrate can also be manufactured as described in steps S21 to S23. For example, after the insulation layer close to an electrode of the array substrate is manufactured using the process provided in this disclosure, the capacitance effect generated when a signal is applied to the electrode can be effectively suppressed. In addition, in the array substrate, protective layers which are used to protect some functional patterns also can be manufactured by the process provided in this disclosure, and as compared with the prior art, the process is greatly simplified.

Below, the manufacturing of the array substrate will be introduced in detail in combination with one embodiment of this disclosure.

Figure 3A:
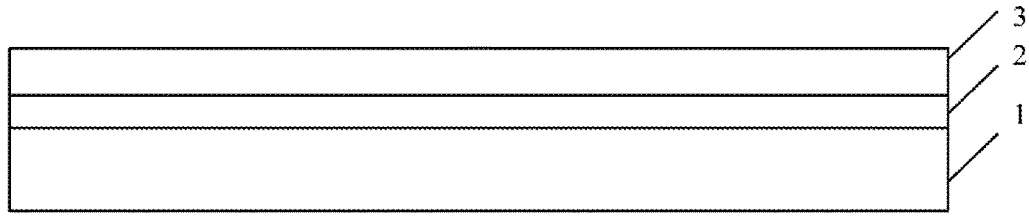
FIGS. 3A-3J are flow charts of manufacturing an array substrate of the present disclosure.
Figure 3B:
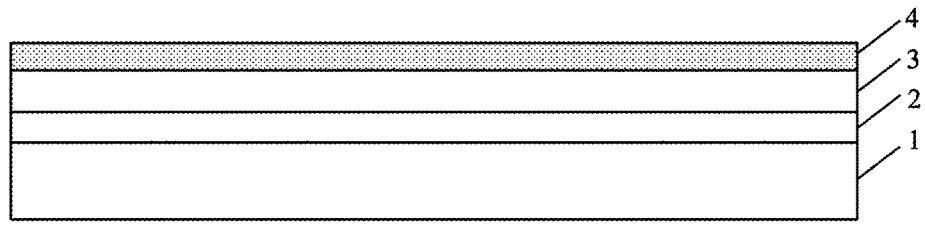
Figure 3C:
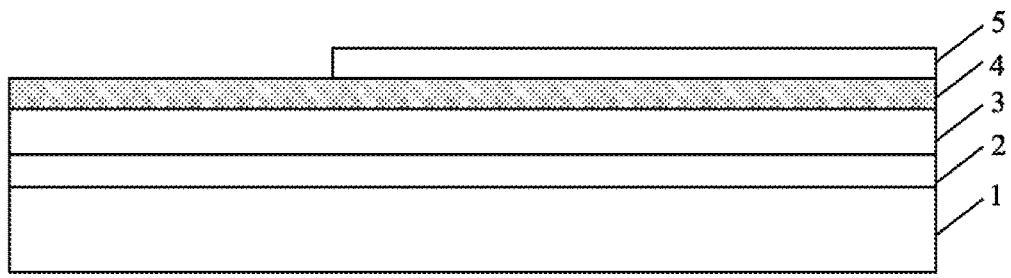
Figure 3D:
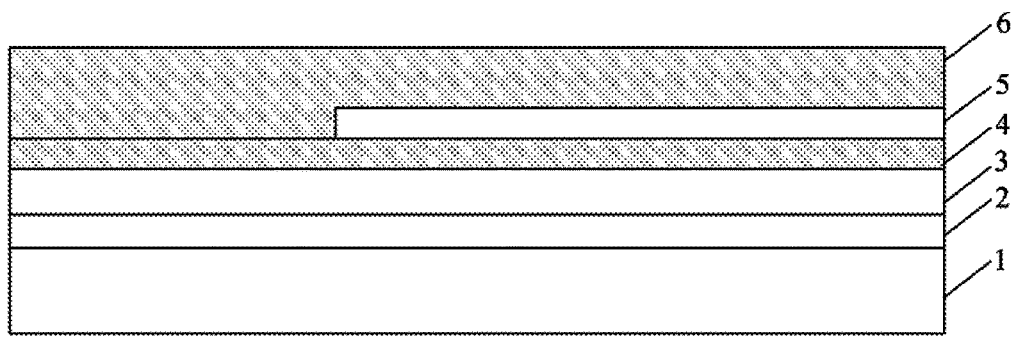
Figure 3E:
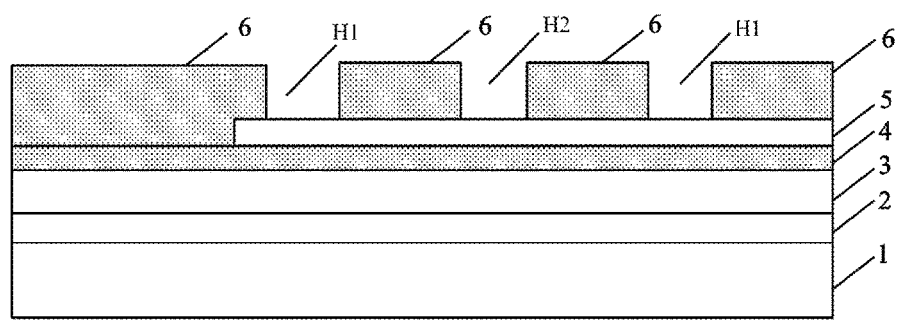
Figure 3F:
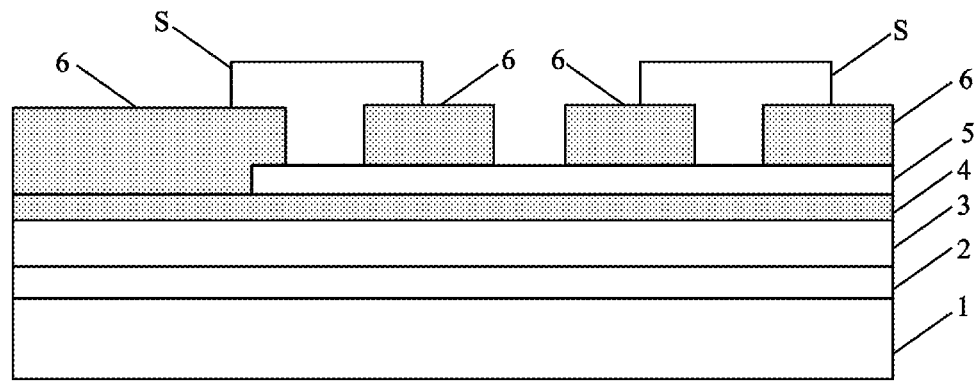

In this embodiment, a bottom gate array substrate will be taken as an example, and the detailed process comprises:

Step 301: referring to FIG. 3A, forming a common electrode 2 and a gate electrode 3 on a base substrate 1 in sequence;

Step 302: referring to FIG. 3B, forming a first insulation layer 4 as described in steps S21 to S23;

Step 303: referring to FIG. 3C, forming an active layer 5 through a mask process;

Step 304: referring to FIG. 3D, forming a second insulation layer 6 as described in steps S21 to S23;

Step 305: referring to FIG. 3E, forming a first via-hole H1 and a second via-hole H2 through a mask process in the second insulation layer 6 at positions corresponding to the active layer 5;

Step 306: referring to FIG. 3F, forming a source electrode S through a mask process, which is connected with the active layer 5 through the first via-hole H1.

It shall be indicated that, in this embodiment, the array substrate having dual source electrodes is taken as an example for introduction. The dual source electrodes form two TFT conductive channels, and can effectively improve the migration efficiency of carriers.

Figure 3G:
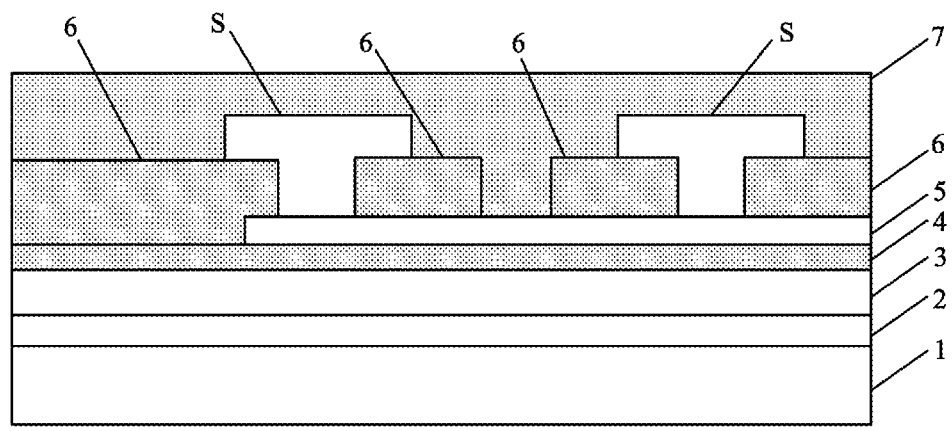
Figure 3H:
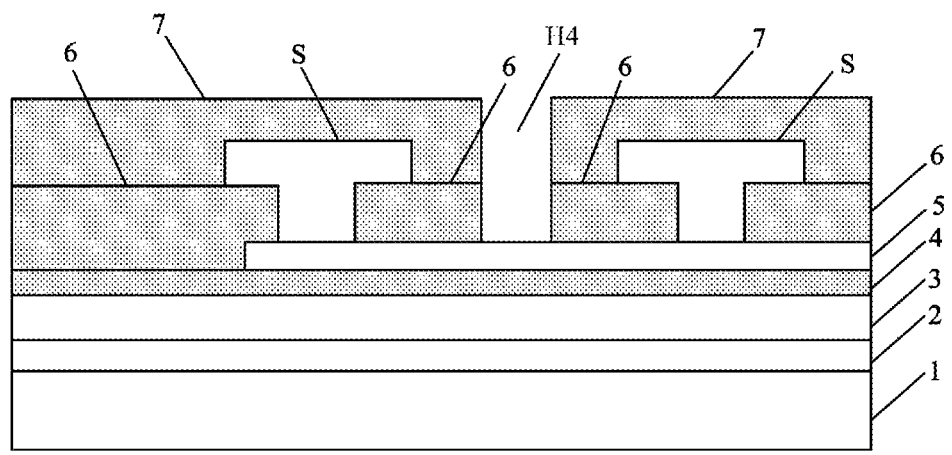
Figure 3I:
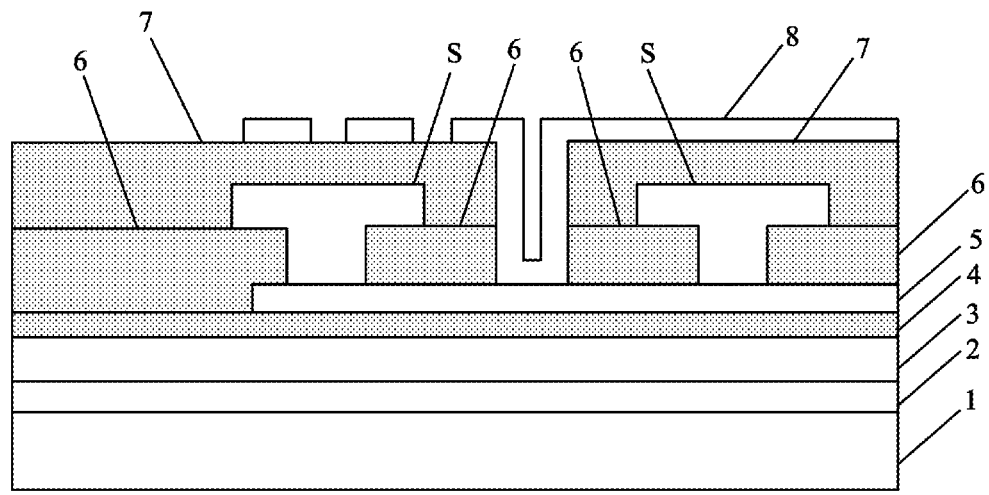
Figure 3J:
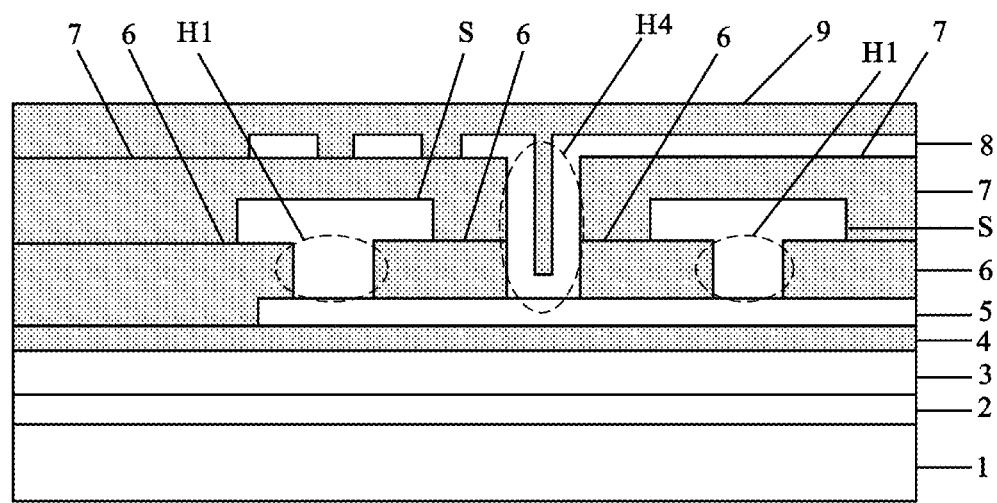

Step 307: referring to FIG. 3G, forming a third insulation layer 7 as described in steps S21 to S23;

Step 308: referring to FIG. 3H, forming a third via-hole in the third insulation layer at a position corresponding to the active layer 5 through a mask process, wherein the third via-hole and the second via-hole H2 communicate with each other to form a fourth via-hole H4;

Step 309: referring to FIG. 3I, forming a pixel electrode 8 through a mask process, which is connected with the active layer 5 through the fourth via-hole H4;

Step 310: referring to FIG. 3J, forming a protective layer 9 as described in steps S21 to S23.

The above is a method for manufacturing the array substrate of this embodiment, wherein the pixel electrode as a drain electrode is directly connected with the active layer, which can accelerate a response speed of receiving data signals. Furthermore, because there is no need to prepare a drain electrode any more, the transverse occupying area of the drain electrode can be saved, thereby improving the aperture ratio.

Accordingly, an embodiment according to the present disclosure further provides an array substrate comprising at least one insulation layer that is a siloxane material layer pattern with an inorganic silicon film covering its outer surface.

Typically, as shown in FIG. 3J, the array substrate of this embodiment comprises:

a gate electrode 3, a source electrode S and an active layer 5 formed on a base substrate 1;

a first insulation layer 4 arranged between the gate electrode 3 and the source electrode S, and a second insulation layer 6 arranged between the source electrode S and the active layer 5, wherein the first insulation layer 4 and the second insulation layer 6 are each a siloxane material layer pattern with an inorganic silicon film covering its outer surface, a first via-hole H1 is formed through the second insulation layer 6 at a first position corresponding to the active layer 5, and the source electrode S is connected with the active layer 5 through the first via-hole H1 in the second insulation layer 6.

Further, the array substrate of this embodiment further comprises a pixel electrode 8 located above the source electrode S, and a third insulation layer 7 arranged between the pixel electrode 8 and the source electrode S. The third insulation layer 7 is a siloxane material layer pattern with an inorganic silicon film covering its outer surface.

A second via-hole is formed through the second insulation layer 6 at a second position corresponding to the active layer 5, and a third via-hole is formed through the third insulation layer 7 at a second position corresponding to the active layer. The second via-hole and the third via-hole communicate with each other to form a fourth via-hole H4. The pixel electrode 8 is connected with the active layer 5 through the fourth via-hole H4.

Moreover, the array substrate of this embodiment further comprises: a protective layer 9 arranged above the pixel electrode 8, which may be a siloxane material layer pattern with an inorganic silicon film covering its outer surface.

Obviously, the insulation layer of the array substrate of this embodiment is obtained by the new process for manufacturing an insulation layer of this disclosure, and thus the same advantageous effects can be produced.

Furthermore, an embodiment of the present disclosure further provides a display apparatus comprising the array substrate. In the display apparatus comprising such an insulation layer having a lower dielectric constant, capacitance effect generated by electrodes can be effectively inhibited, and a more stable display effect can be provided.

The above are only alternative embodiments of the present disclosure. It shall be indicated that several improvements and modifications can be made by a person skilled in the art without departing from the principle of the present disclosure. These improvements and modifications should be also deemed within the protection scope of the present disclosure.

What is claimed is:

1. A method for manufacturing a thin film transistor, comprising a step of forming an insulation layer, wherein the step of forming the insulation layer comprises:

forming a siloxane material layer;

oxidizing the siloxane material layer such that an inorganic silicon film is formed on a surface of the siloxane material layer; and curing the oxidized siloxane material layer to obtain the insulation layer, wherein the thin film transistor comprises:

one or more insulation layers, a gate electrode, at least two source electrodes, and an active layer, wherein at least one insulation layer is a siloxane material layer pattern with an inorganic silicon film covering its outer surface, wherein the insulation layer comprises a first insulation layer arranged between the gate electrode and the at least two source electrodes, and a second insulation layer arranged between the at least two source electrodes and the active layer;

wherein the active layer is arranged between the first insulation layer and the at least two source electrodes; and wherein a first via-hole is formed through the second insulation layer at a first position corresponding to the active layer, and the at least two source electrodes are connected with the active layer through the first via-hole.

2. The manufacturing method according to claim 1, wherein the step of forming the siloxane material layer comprises forming the siloxane material layer in one step by a coating or spin-coating process.

3. The manufacturing method according to claim 1, wherein the step of oxidizing the siloxane material layer comprises oxidizing the siloxane material layer through UV light or ozone.

4. A method for manufacturing an array substrate, comprising steps of forming a plurality of insulation layers, wherein the step of forming at least one of the plurality of insulation layers comprises:

forming a siloxane material layer;

oxidizing the siloxane material layer such that an inorganic silicon film is formed on a surface of the siloxane material layer; and curing the oxidized siloxane material layer to obtain the insulation layer, wherein the array substrate comprises:

one or more insulation layers, a gate electrode, at least two source electrodes, and an active layer, wherein at least one insulation layer is a siloxane material layer pattern with an inorganic silicon film covering its outer surface, wherein the insulation layer comprises a first insulation layer arranged between the gate electrode and the at least two source electrodes, and a second insulation layer arranged between the at least two source electrodes and the active layer;

wherein the active layer is arranged between the first insulation layer and the at least two source electrodes; and wherein a first via-hole is formed through the second insulation layer at a first position corresponding to the active layer, and the at least two source electrodes are connected with the active layer through the first via-hole.

5. The manufacturing method according to claim 4, wherein the step of forming the siloxane material layer comprises forming the siloxane material layer in one step by a coating or spin-coating process.

6. The manufacturing method according to claim 4, wherein the step of oxidizing the siloxane material layer comprises oxidizing the siloxane material layer through UV light or ozone.

7. A thin film transistor, comprising:

one or more insulation layers, a gate electrode, at least two source electrodes, and an active layer, wherein at least one insulation layer is a siloxane material layer pattern with an inorganic silicon film covering its outer surface, wherein the insulation layer comprises a first insulation layer arranged between the gate electrode and the at least two source electrodes, and a second insulation layer arranged between the at least two source electrodes and the active layer;

wherein the active layer is arranged between the first insulation layer and the at least two source electrodes; and wherein a first via-hole is formed through the second insulation layer at a first position corresponding to the active layer, and the at least two source electrodes are connected with the active layer through the first via-hole.

8. An array substrate, comprising:

one or more insulation layers, a gate electrode, at least two source electrodes, and an active layer, wherein at least one insulation layer is a siloxane material layer pattern with an inorganic silicon film covering its outer surface, wherein the insulation layer comprises a first insulation layer arranged between the gate electrode and the at least two source electrodes, and a second insulation layer arranged between the at least two source electrodes and the active layer;

wherein the active layer is arranged between the first insulation layer and the at least two source electrodes; and wherein a first via-hole is formed through the second insulation layer at a first position corresponding to the active layer, and the at least two source electrodes are connected with the active layer through the first via-hole.

9. The array substrate according to claim 8, wherein the at least two source electrodes are located above the gate electrode, and the array substrate further comprises a pixel electrode located above the at least two source electrodes;

the insulation layer further comprises a third insulation layer arranged between the pixel electrode and the at least two source electrodes;

a second via-hole is formed through the second insulation layer at a second position corresponding to the active layer, a third via-hole is formed through the third insulation layer at a second position corresponding to the active layer, the second via-hole and the third via-hole communicate with each other to form a fourth via-hole, and the pixel electrode is connected with the active layer through the fourth via-hole.

10. The array substrate according to claim 9, wherein the insulation layer further comprises a protective layer arranged above the pixel electrode.

11. A display apparatus, comprising the array substrate according to claim 8.

12. The manufacturing method according to claim 2, wherein the step of oxidizing the siloxane material layer comprises oxidizing the siloxane material layer through UV light or ozone.

13. The manufacturing method according to claim 5, wherein the step of oxidizing the siloxane material layer comprises oxidizing the siloxane material layer through UV light or ozone.

14. The display apparatus according to claim 11, wherein the at least two source electrodes are located above the gate electrode, and the array substrate further comprises a pixel electrode located above the at least two source electrodes;

the insulation layer further comprises a third insulation layer arranged between the pixel electrode and the at least two source electrodes;

a second via-hole is formed through the second insulation layer at a second position corresponding to the active layer, a third via-hole is formed through the third insulation layer at a second position corresponding to the active layer, the second via-hole and the third via-hole communicate with each other to form a fourth via-hole, and the pixel electrode is connected with the active layer through the fourth via-hole.

15. The display apparatus according to claim 14, wherein the insulation layer further comprises a protective layer arranged above the pixel electrode.

16. The array substrate according to claim 9, wherein the fourth via-hole is arranged between the at least two source electrodes.

* * * * *